(12) United States Patent
Cho et al.

(10) Patent No.: US 6,965,622 B1
(45) Date of Patent: Nov. 15, 2005

(54) WAVELENGTH LOCKING SCHEME AND ALGORITHM FOR ULTRA-HIGH DENSITY WDM SYSTEM

(75) Inventors: Si Hyung Cho, Silver Spring, MD (US); Ilya Lyubomirsky, Columbia, MD (US); Doyle Nichols, Ellicott City, MD (US); Gerald McAdoo, Silver Spring, MD (US); Larry Davis, Columbia, MD (US)

(73) Assignee: Ciena Corporation, Linthicum, MD (US)

( * ) Notice: Subject to any disclaimer, the term of this patent is extended or adjusted under 35 U.S.C. 154(b) by 302 days.

(21) Appl. No.: 10/353,242

(22) Filed: Jan. 28, 2003

Related U.S. Application Data

(60) Provisional application No. 60/352,315, filed on Jan. 28, 2002.

(51) Int. Cl.[7] .............................................. H01S 3/00
(52) U.S. Cl. ..................................... 372/38.01; 372/33
(58) Field of Search ....................... 372/35, 20, 29.011, 372/107, 108, 32, 33, 29.01, 29.03, 34–36, 372/38.01, 38.02

(56) References Cited

U.S. PATENT DOCUMENTS

| | | | |
|---|---|---|---|
| 5,875,273 A | 2/1999 | Mizrahi et al. | |
| 5,943,152 A | 8/1999 | Mizrahi et al. | |
| 6,198,757 B1 * | 3/2001 | Broutin et al. | 372/32 |
| 6,272,157 B1 * | 8/2001 | Broutin et al. | 372/32 |
| 6,369,926 B1 * | 4/2002 | Lyu et al. | 398/95 |
| 6,711,188 B2 * | 3/2004 | Ito et al. | 372/32 |

* cited by examiner

Primary Examiner—Minsun Oh Harvey
Assistant Examiner—Tuan N. Nguyen
(74) Attorney, Agent, or Firm—Michael R. Cammarata; David L. Soltz

(57) ABSTRACT

The present invention is directed toward a laser wavelength locking scheme suitable for incorporation into WDM systems having channel spacings of 25 GHz or less. In a preferred embodiment, light output from the laser is supplied to a filtering element, such as an in-fiber Bragg grating or an etalon, and photodetectors are used to sense light transmitted through and either reflected by the filtering element or input to the filtering element. A measured ratio corresponding to a quotient of the photocurrents generated by the photodetectors is calculated and compared to a desired ratio corresponding to a measured temperature of the filtering element when the filtering element transmits the desired wavelength to be locked. Based on the comparison of the desired and measured ratios, a temperature error value is calculated which is used to adjust the laser temperature, as well as the laser wavelength. Accordingly, the temperature of the filtering element, for example, influences the laser temperature, so that wavelength variations stemming from temperature induced changes in the filtering element and other components in the laser package can be compensated, and the output wavelength can remain substantially fixed.

15 Claims, 9 Drawing Sheets

WAVELENGTH LOCKING SCHEME AND ALGORITHM FOR ULTRA-HIGH DENSITY WDM SYSTEM

This application claims priority of U.S. Provisional Application Ser. No. 60/352,315 filed Jan. 28, 2002.

BACKGROUND OF THE INVENTION

Wavelength division multiplexing (WDM) optical communication systems have been deployed to increase capacity of existing optical fiber networks. In a WDM system, multiple optical signals having different wavelengths are combined onto a single optical fiber. After traveling through the fiber, the signals are then separated according to wavelength, and subject to further processing.

Most deployed fiber is silica-based, and typically has a relatively narrow, low absorption band centered about 1550 nm. Accordingly, in order to increase capacity further IN a WDM system, optical signal wavelengths are spectrally spaced close to one another. For example, early WDM systems had signal or channel spacings of about 100 GHz, but as capacity needs increased, later generation WDM systems were developed having narrower channel spacings of 50 GHz. Capacity requirements continue to increase, and even narrower channel spaced systems having spacing of 25 GHz or less are expected.

Each optical signal or channel in a WDM system is generated by a laser, typically, a semiconductor chip, which outputs light at one of the WDM channel wavelengths. Temperature variations can cause the wavelength of light output from the chip to vary. Accordingly, the laser chip temperature is tightly controlled. In addition, various wavelength locking schemes have been developed to keep the output wavelength locked to the desired channel wavelength. Such schemes are described, for example, in U.S. Pat. Nos. 5,875,273 and 5,943,152, incorporated by reference herein.

In conventional laser wavelength locking schemes, a portion of light emitted by a laser is supplied to a filter having an associated transmission spectrum that permits appropriate feedback circuitry to determine when the laser is locked to a desired wavelength. A thermo electric cooler (TEC) coupled to the feedback circuit controls the temperatures of the laser, so that the laser continues to output light at that wavelength. However, laser wavelength can drift with over extended periods of time. Moreover, the laser and the filter are often packaged within a common housing (often a hermetic "butterfly" package), and non-linear temperature distributions in the package are believed to cause refractive index changes in the filter, as well as thermal expansion of the filter and other optics in the package. In addition, these thermal variations are believed to change the physical dimensions of the laser chip. As a result, the output wavelength can change, even if conventional laser locking techniques are employed. In spectrally dense WDM system with narrow channel spacings, such channel drift can lead to one channel interfering with another, resulting in an unacceptable loss of data.

BRIEF DESCRIPTION OF THE DRAWINGS

Advantages of the present invention will be apparent from the following detailed description of the presently preferred embodiments thereof, which description should be considered in conjunction with the accompanying drawings in which.

DETAILED DESCRIPTION OF THE PREFERRED EMBODIMENTS

The present invention is directed toward a laser wavelength locking scheme suitable for incorporation into WDM systems having channel spacings of 25 GHz or less. In a preferred embodiment, light output from the laser is supplied to a filtering element, such as an in-fiber Bragg grating or an etalon, and photodetectors are used to sense light transmitted by the filtering element and input to the filtering element. Alternatively one of the photodetectors senses light reflected by the filtering element. A measured ratio corresponding to a quotient of the photocurrents generated by the photodetectors or the quotient itself is calculated and compared to a desired ratio corresponding to a measured temperature of the filtering element when the filtering element transmits the desired wavelength to be locked. Based on the comparison of the desired and measured ratios, a temperature error value is calculated which is used to adjust the laser temperature, as well as the laser wavelength. Accordingly, the temperature of the filtering element, for example, influences how much the laser temperature is changed, so that wavelength variations stemming from temperature induced changes in the filtering element and other components in the laser package can be compensated, and the output wavelength can remain substantially fixed.

Figure 1:
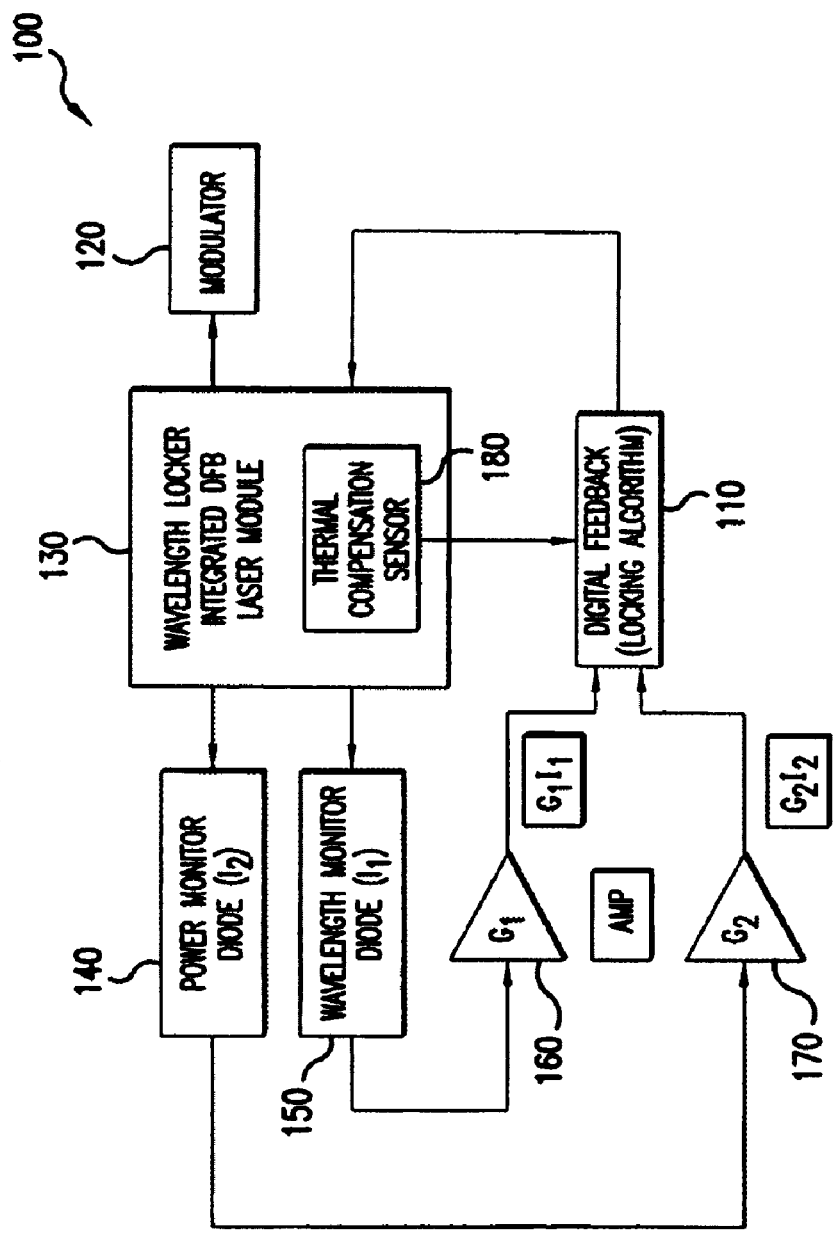
FIG. 1 illustrates a block diagram of wavelength locking apparatus consistent with an embodiment of the present invention.

Turning to the drawings in which like reference characters indicate the same or similar elements in each of the several views, FIG. 1 illustrates a block diagram of a laser wavelength locking device 100 consistent with an aspect of the present invention. Wavelength locking device includes a wavelength locker integrated distributed feedback (DFB) laser module 130, which supplies a continuous wave optical output to external modulator 120. External modulator 120 modulates the received light in accordance with information to be transmitted on a span of optical fiber (not shown). Power and wavelength monitor diode outputs 140 and 150, respectively, supply electrical signals to corresponding electrical amplifiers 160 and 170, respectively. Amplifiers 160 and 170 have respective gains $G_1$ and $G_2$, and the amplifier outputs ($G_1I_1$ and $G_2I_2$) are both fed to control or digital feedback circuitry 110. Digital feedback circuitry 110 also receives an output from a thermal compensation sensor 180. As discussed in greater detail below, digital feedback circuitry 110 provides control signals for appropriately adjusting the wavelength of light output from the DFB laser in module 130.

Figure 2:
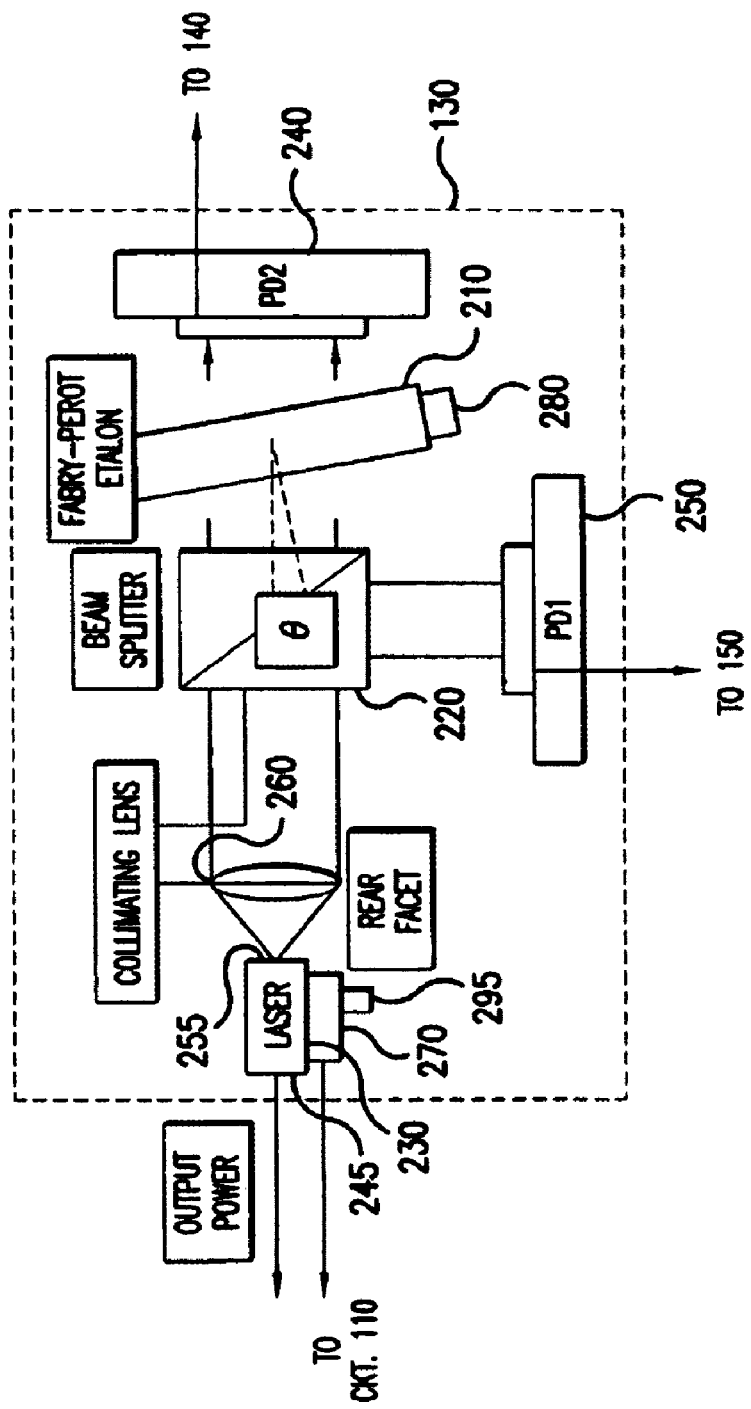
FIG. 2 illustrates a more detailed diagram of portion of the wavelength locking apparatus shown in FIG. 1.

An exemplary module 130 is shown in greater detail in FIG. 2. Module 130 includes an optical source such as DFB laser chip 230 having a front facet 245 supplying light or output power to modulator 120, and a back or rear facet 255 emitting less light is fed to a lens 260. The light is collimated by lens 260 and supplied to a beam splitter 220 which supplies first portion and second portions of the incoming light to optical-to-electrical conversion circuitry or photoelectric conversion circuitry including photodetectors PD2 240 and PD1 250. Photodetector 250 receives a first portion of the light and generates on output 150 having a first value of a photoelectric parameter, such as photocurrent $I_1$ or a photovoltage, corresponding to the intensity of the received light. An additional portion of collimated light is passed to a filtering element such as a conventional Fabry-Perot etalon 210 positioned at an optimum angle θ relative to the collimated light. Etalon 210 has a known transmission characteristic which is a function θ and the wavelength of the input light. Light transmitted through etalon 210 constituting a second portion of the light output from laser 230 is received by photodetector 240, which, in turn, generates a second value of the photoelectric parameter (e.g., photocurrent $I_2$ or photovoltage) corresponding to an intensity associated with the second portion on output 140.

As further shown in FIG. 2, a wavelength adjustment circuit, such as TEC 270, can be provided to control the temperature, and thus, the wavelength of light output from laser 230. Moreover, a temperature sensor circuit or thermal compensation sensor 180, includes, for example a thermistor 280 positioned to sense a temperature at a location spaced from laser 230. In the example shown in FIG. 2, thermistor 280 is spaced from laser 230 and senses temperature of etalon 210. Optionally, an additional thermistor 295 can be provided to monitor the temperature of laser 230.

Figure 3:
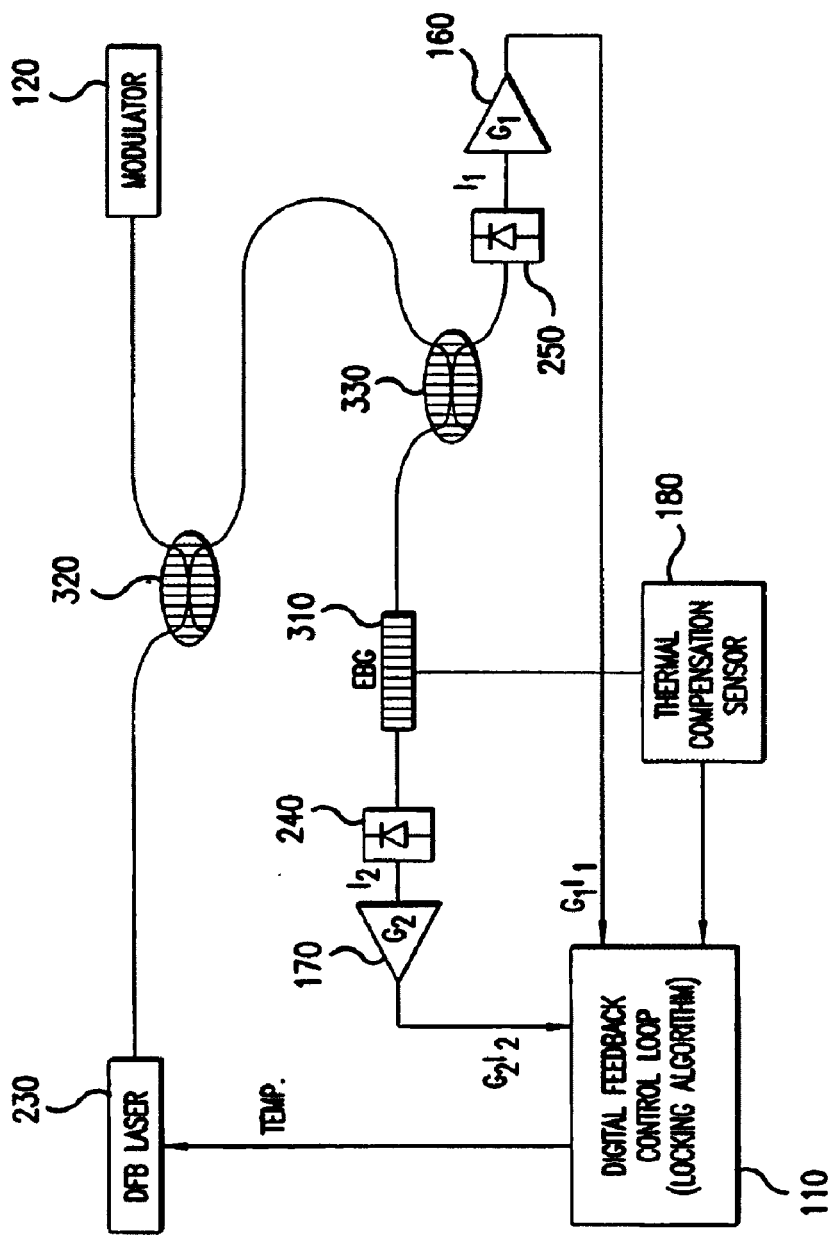
FIG. 3 illustrates a block diagram of a wavelength locking apparatus consistent with an alternative embodiment of the present invention.

FIG. 3 illustrates an alternative embodiment, in which the filtering element includes an in-fiber Bragg grating 310. In this embodiment, light output from the front facet of laser 230 is supplied to a fiber optic coupler or splitter 320, which taps off a part of the received light, while the rest is passed to modulator 120. The tapped part is next supplied to an additional coupler 330 which directs the light to in-fiber Bragg grating 310. Grating 310 transmits a portion of the light to photodetector or photodiode 240, but reflects another portion of the light to photodetector 250 via coupler 330. Operation of electronic amplifiers 160 and 170, digital feedback control loop 110 and thermal compensation sensor is similar to that described above in connection with the description of the embodiment shown in FIG. 1.

Figure 4:
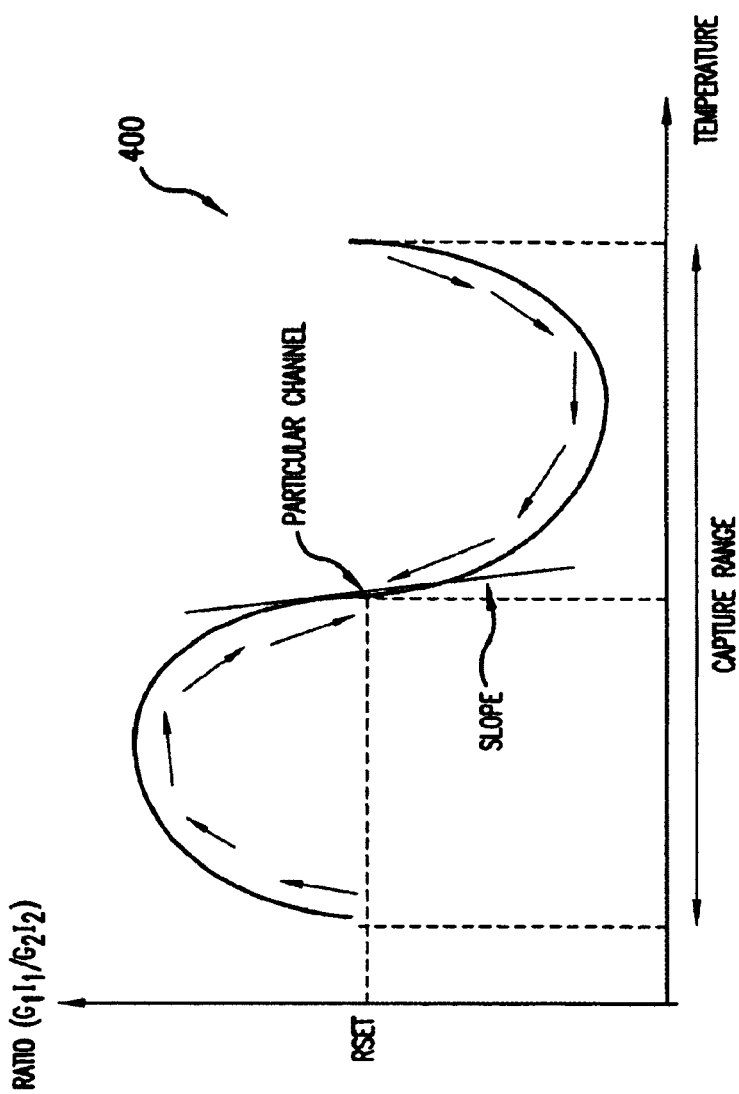
FIG. 4 illustrates a characteristic of a ratio (described in greater detail below) as a function of chip temperature.

Exemplary operation of the circuitry shown in FIGS. 1–3 above will next be described with reference to FIG. 4 illustrating a characteristic plot 400 of a photoelectric parameter such as a "ratio" as a function of laser chip temperature. In the present example, the ratio is defined at $G_1I_1/G_2I_2$ where $I_1$ and $I_2$ are the photocurrents generated by photodetectors 250 and 240, respectively, and $G_1$ and $G_2$ are the gains of corresponding amplifiers 160 and 170 discussed above. Thus, the ratio is related to a quotient of the photocurrents $I_1$ and $I_2$. Alternatively, the ratio may be made equal to the quotient of $I_1$ and $I_2$. In the discussion below the ratio is presented as the quotient multiplied by a factor of $G_1/G_2$, but it is understood that either the quotient $I_1/I_2$ or $G_1I_1/G_2I_2$ may be used as the ratio.

The characteristic is typically generated empirically by measuring ratios and corresponding chip temperatures. At a point on the characteristic corresponding to a particular chip temperature and ratio $R_{SET}$, the laser outputs light having a particular channel wavelength corresponding to a desired WDM wavelength for that laser. The slope of the characteristic through this point is substantially linear.

By adjusting laser chip temperature to obtain the desired predetermined ratio $R_{SET}$, the laser will remain substantially locked to the desired wavelength. In particular, the following formula can be used to set chip temperature to yield a desired wavelength:

$$OpticalSourceTemp = OldOpticalSourceTemp \pm \frac{SecondVal - FirstVal}{Slope}$$

where OpticalSourceTemp is the adjusted temperature of laser 230, Old OpticalSourceTemp is a previous temperature of laser 230 associated with a measured ratio, SecondVal is $R_{SET}$, FirstVal is the measured ratio, and Slope is a slope characteristic shown in FIG. 4 through the particular channel point. In the above formula, the term (SecondVal−FirstVal)/Slope corresponds to a temperature error value to be used to correct or adjust the temperature, and thus the wavelength, of laser 230. In effect, by subtracting the measured ratio from the $R_{SET}$, and dividing by the slope of the characteristic, the chip temperature is changed (i.e., moved along the x-axis in FIG. 4) to correspond to $R_{SET}$.

Figure 5:
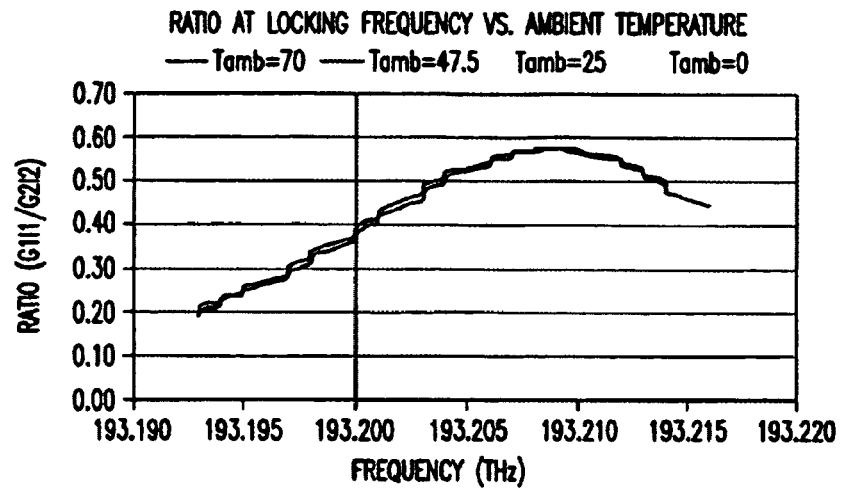
FIG. 5 illustrates a family of plots of ratios as a functions of laser frequency.
Figure 6:
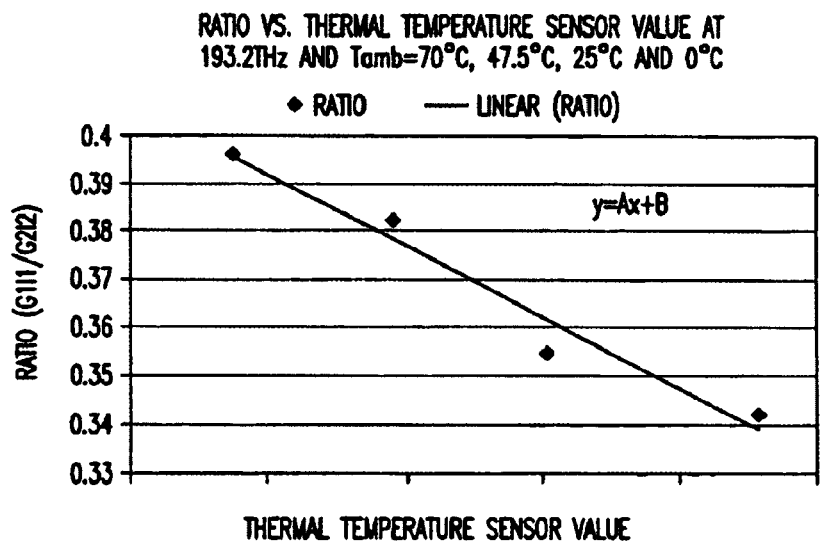
FIG. 6 illustrates is a characteristic of ratio as a function of thermal sensor values.

$R_{SET}$ itself, however, changes with temperature. As shown in FIG. 5, for example, the ratio associated with a desired wavelength or frequency such as 193.2 changes with ambient temperature. Nevertheless, as shown in FIG. 6, ratios can be plotted as function of temperature measured by a thermal compensation sensor, such as thermistor 280, spaced from laser 230. For example, FIG. 6 was generated by obtaining selected ratios from FIG. 5 at different temperatures for a desired locking wavelength, and plotting these ratios as a function of temperature sensor values or thermistor 280 resistance values. Then, using Newton's Method, a straight-line plot was obtained (although any suitable function can be used). Once the $R_{SET}$, thermistor value curve is obtained, $R_{SET}$ can be determined for any temperature measured by the thermistor by first determining the thermistor temperature and then deriving the corresponding $R_{SET}$ value. This $R_{SET}$ value can then be plugged into the above formula to calculate an adjusted laser temperature, i.e., OpticalSourceTemp.

Figure 7:
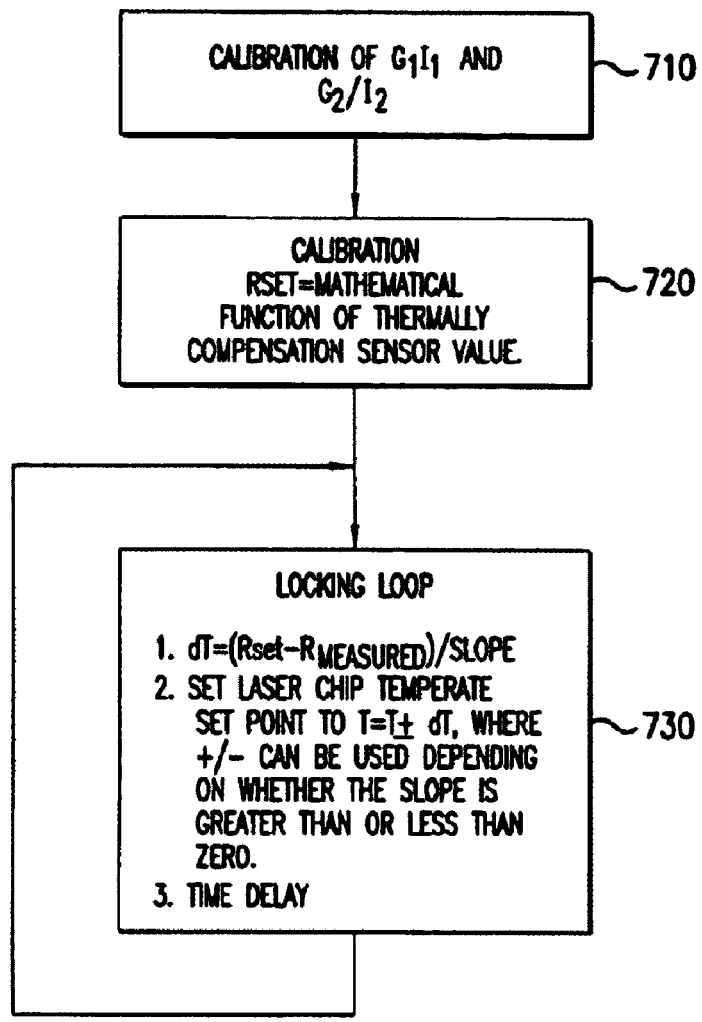
FIG. 7 illustrates a wavelength control method consistent with an aspect of the present invention.

FIG. 7 illustrates a method consistent with the present invention for locking a laser output wavelength. In step 710, $G_1I_1$ and $G_2I_2$ are calibrated to generate the family of curves shown in FIG. 5, and thereby obtain a series of $R_{SET}$ values and corresponding temperatures for a desired wavelength or frequency (in this instance 193.2 THz), as noted above. In step 720, these $R_{SET}$ values are calibrated to obtain an $R_{SET}$ vs. a parameter associated with these temperatures, such as a resistance of thermistor 280, at a location spaced from laser 230. In step 730, a temperature error value dT is calculated, as discussed above, and the laser chip temperature (OpticalSourceTemp) is set to a previous temperature value minus the error value, provided that the slope is negative. If the slope is positive, however, the error value is added to the previous laser chip temperature. After an appropriate time delay, a new error value is calculated and the laser chip temperature is adjusted again. The procedures in step 730 are then repeated or looped to maintain laser operation at the desired wavelength. It is noted that the slope is typically obtained by a separate calibration at ambient temperature by obtaining $R_{SET}$ values for various laser chip temperatures, as shown in FIG. 4.

Figure 8:
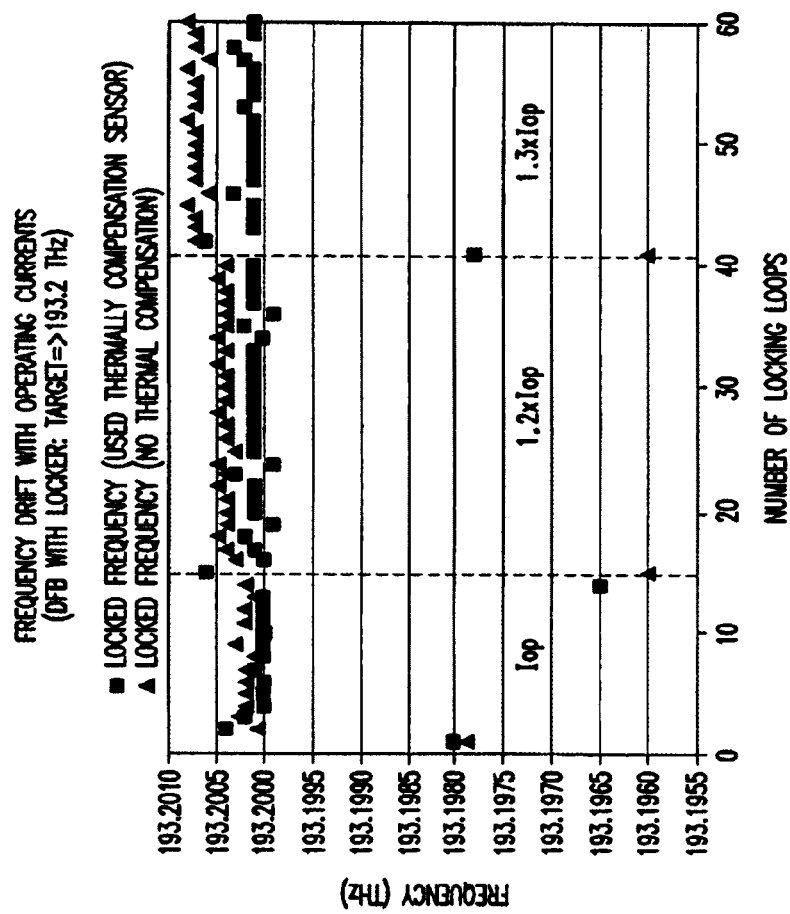
FIG. 8 illustrates a plot of frequency drift for different laser currents Iop for both a convention locking technique and a locking technique incorporation features of the present invention.

Advantages of the present invention will next be described with reference to FIGS. 8 and 9. In FIG. 8, laser output frequency is plotted for various laser current magnitudes Iop. Typically, laser current is increased over the lifetime of a laser in order to maintain consistent output power. Such increased current, however, can increase laser temperature and cause wavelength drift. As a result, conventional laser wavelength locking techniques fail to restrict the resulting changes in wavelength, (see plot of triangle points in FIG. 8), while output wavelength of a locker incorporating features of the present invention remains substantially fixed (see plot of square points in FIG. 8).

Figure 9:
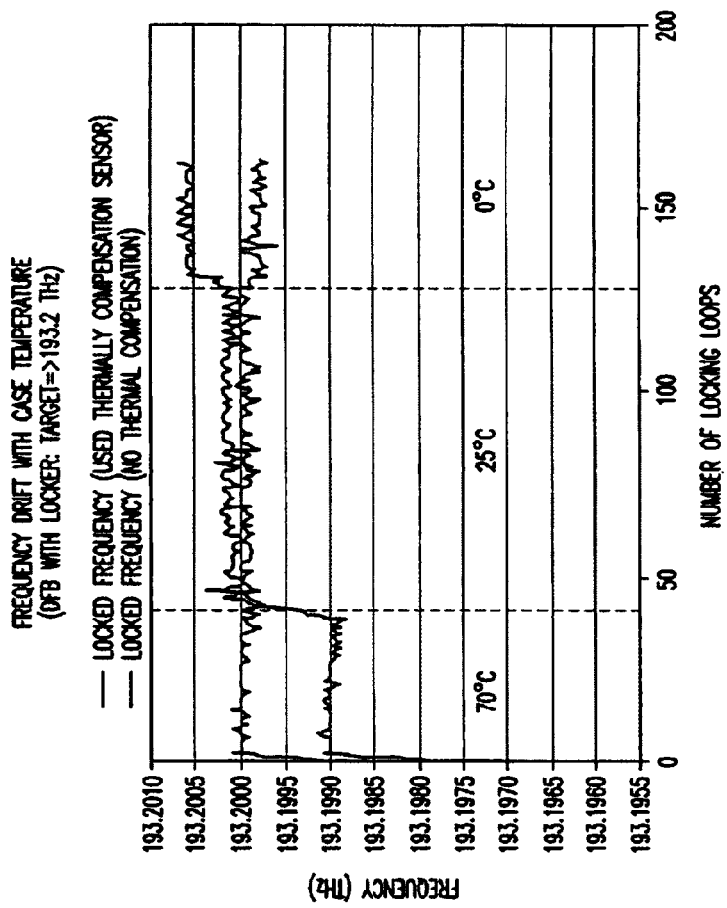
FIG. 9 illustrates a plot of frequency drift as a function of case or laser package temperature.

Turning to FIG. 9, laser frequency (related to wavelength by a constant) is plotted for different laser case or packaging temperatures for a conventional laser locking scheme (black line) and a laser locking scheme incorporating features of the present invention (gray line). The number of loops associated with each temperature is also shown in connection with the gray line plot. As seen in FIG. 9, the laser locking scheme of the present invention achieves a stable output wavelength over a wide range of laser case temperatures from 0°–70° C.

Figure 10:
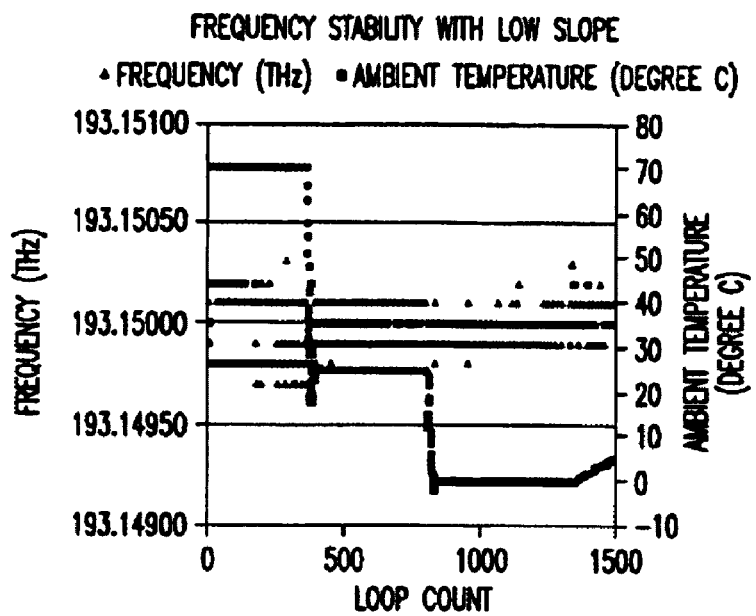
FIGS. 10 and 11 are plots of laser frequency and ambient temperature as functions of loop count.
Figure 11:
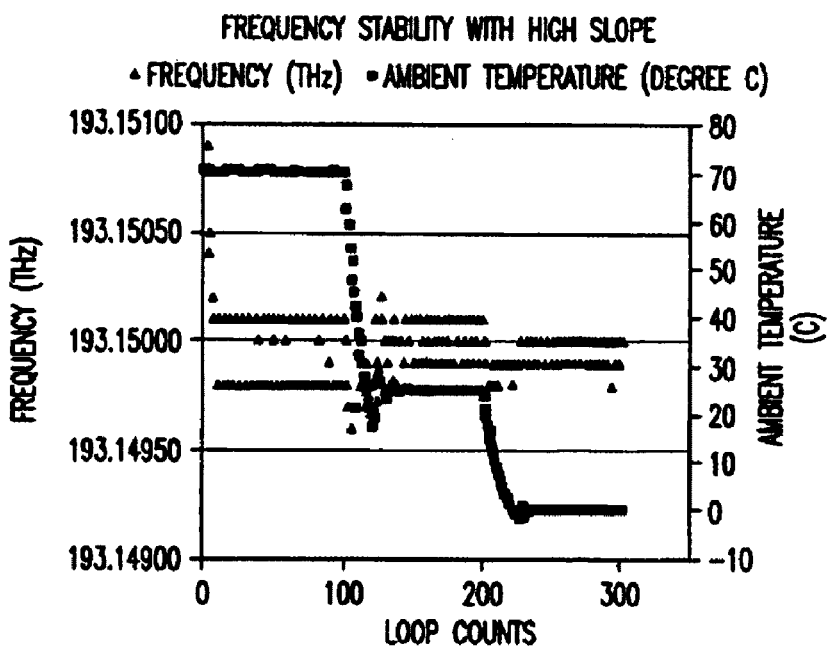

As noted above, the slope portion of characteristic 400 shown in FIG. 4 is used to calculate how much laser chip temperature should be changed in order to obtain a desired wavelength. FIG. 11 is a plot of both laser frequency and ambient temperature as a function of loop counts, or number of times step 730 of FIG. 7 is performed. As further shown in FIG. 11, a relatively high slope reduces wavelength fluctuation in the event of sudden and extreme ambient temperature changes, but results in a relatively slow temporal response of the locking loop (step 730 in FIG. 7). Conversely, as shown in FIG. 10, which is also a plot of laser frequency and ambient temperature as a functions loop count, a lower slope results in higher wavelength fluctuation, but improved temporal response. Accordingly, a slope may be chosen that optimizes both wavelength fluctuation and temporal response.

While the foregoing invention has been described in terms of the embodiments discussed above, numerous variations are possible. Accordingly, modifications and changes such as those suggested above, but not limited thereto, are considered to be within the scope of the following claims.

What is claimed is:

1. An optical device, comprising:
   an optical source, said optical source being configured to emit light;
   wavelength adjusting circuitry operatively coupled to said optical source, said wavelength adjusting circuitry being configured to control a wavelength of said optical source in response to a control signal;
   an optical filtering element optically coupled to said optical source, said optical filtering element having a wavelength dependent transmission characteristic;
   optical-to-electrical conversion circuitry optically coupled to said optical filtering element, said optical-to-electrical conversion circuitry being configured to output electrical signals in response to said light, said optical-to-electrical conversion circuitry including first and second photodetectors, said first photodetector being configured to detect a first portion of said light from said filtering element, and said second photodetector being configured to detect a second portion of said light; and
   temperature sensor circuitry spaced from said optical source, said temperature sensor circuitry being configured to output a sense signal indicative of a temperature at a location spaced from said optical source;
   control circuitry coupled to said wavelength adjusting circuitry and said temperature sensor circuitry, said control circuitry being configured to supply said control signal to said wavelength adjusting circuitry,
   wherein said control circuit generates said control signal in response to said sense signal and a first quotient of a first value of a first electrical signal generated by said first photodetector and a second value of a second electrical signal generated by said second photodetector
   said wavelength adjusting circuit adjusting a wavelength of said light such that said control circuit determines a second quotient of a third value of a third electrical signal generated by said first photodetector and a fourth value of a fourth electrical signal generated by said second photodetector, said second quotient substantially corresponding to a predetermined ratio associated with said temperature.

2. An optical device in accordance with claim 1, wherein said optical source includes a laser.

3. An optical device in accordance with claim 1, wherein said filtering element includes an in-fiber Bragg grating.

4. An optical device in accordance with claim 1, wherein said filtering element includes an etalon.

5. An optical device in accordance with claim 1, wherein said wavelength adjusting circuitry includes a thermo electric cooler, said thermo electric cooler being controlled in response to said control signal to adjust a temperature of said optical source, and thereby adjust a wavelength of said light.

6. An optical device in accordance with claim 1, wherein said temperature sensor circuitry includes a thermistor.

7. An optical device in accordance with claim 6, wherein said thermistor is configured to sense a temperature of said filtering element.

8. An optical device in accordance with claim 6, wherein said thermistor is a first thermistor, said optical device further comprising a second thermistor configured to generate a signal indicative of a temperature of said optical source.

9. A method of controlling a wavelength of light emitted by an optical source using a wavelength adjuster operatively coupled to the optical source, the wavelength adjuster being configured to control a wavelength of the optical source in response to a control signal, the method comprising:
   measuring a first value of a photoelectric parameter generated by a first photodetector receiving a first portion of said light from a filtering element optically coupled to the optical source;
   measuring a second value of a photoelectric parameter generated by a second photodetector receiving a second portion of said light;
   determining a quotient of said first and second photoelectric parameter values;
   measuring a temperature at a location spaced from the optical source; and
   generating the control signal for the wavelength adjuster to adjust a wavelength of said light, said control signal being generated based on the quotient and a characteristic function relating a desired quotient value and the measured temperature.

10. A method of controlling a wavelength of light emitted by an optical source using a wavelength adjuster operatively coupled to the optical source, the wavelength adjuster being configured to adjust a wavelength of the optical source by adjusting a temperature of said optical source in response to a control signal, the method comprising:

measuring a first value of a photoelectric parameter corresponding to a quotient of a first photodetector output generated in response to a first portion of said light received by the first photodetector from a filtering element optically coupled to the optical source, and a second photodetector output generated in response to a second portion of said light;

measuring a temperature at a location spaced from said optical source;

determining a second value of said photoelectric parameter based on said temperature;

adjusting a wavelength of said light with the wavelength adjuster in accordance with the following formula:

$$OpticalSourceTemp = OldOpticalSourceTemp \pm \frac{SecondVal - FirstVal}{Slope}$$

where OpticalSourceTemp is the adjusted temperature, OldOpticalSourceTemp is a temperature of said optical source associated with the first value of said photoelectric parameter, SecondVal is said determined second value of said photoelectric parameter, FirstVal is said first value of said photoelectric parameter, and Slope is a slope of a photoelectric parameter vs. temperature function.

11. A method in accordance with claim 10, wherein said determining step further includes the step of measuring a parameter associated with said temperature and identifying said second value of said photoelectric parameter corresponding to said measured parameter associated with said temperature.

12. A method in accordance with claim 11, wherein said measured parameter is a resistance of a thermistor configured to sense said temperature.

13. A method in accordance with claim 10, wherein said photoelectric parameter is selected from a photocurrent or a photovoltage.

14. A method in accordance with claim 10, said adjusting step adjusting the wavelength of said light with the wavelength adjuster to yield a third value of said photoelectric parameter associated with said light, said third value of said photoelectric parameter value being substantially equal to said second value of said photoelectric parameter.

15. An optical device, comprising:

an optical source;

an optical filtering element optically coupled to said optical source;

photoelectric conversion circuitry optically coupled to both said optical filtering element and said optical source, said photoelectric conversion circuitry being configured generate output electrical signals in response to light originating from said source;

a temperature sensor circuit configured to sense a temperature at a location spaced from said optical source;

a control circuit configured to determine a desired first value based on said temperature and a function relating first values and temperature; and a wavelength adjustment circuit configured to adjust a wavelength of said light such that a quotient formed from said output electrical signals has an associate second value substantially equal to said desired first value.

\* \* \* \* \*